(12) United States Patent
Tonami et al.

(10) Patent No.: US 6,838,377 B2
(45) Date of Patent: Jan. 4, 2005

(54) HIGH FREQUENCY CIRCUIT CHIP AND METHOD OF PRODUCING THE SAME

(75) Inventors: Yoshiyuki Tonami, Machida (JP); Mitsunori Hatada, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/087,915

(22) Filed: Mar. 5, 2002

(65) Prior Publication Data

US 2002/0125566 A1 Sep. 12, 2002

(30) Foreign Application Priority Data

Mar. 5, 2001 (JP) ........................................ 2001-060061

(51) Int. Cl.⁷ .............................................. H01L 21/44
(52) U.S. Cl. ....................... 438/667; 438/669; 438/670; 257/728; 216/13
(58) Field of Search ........................... 216/13; 438/612, 438/614, 617, 666, 667, 677, 669–671; 257/728, 784, 786

(56) References Cited

U.S. PATENT DOCUMENTS

| | | | | |
|---|---|---|---|---|
| 4,665,468 A | * | 5/1987 | Dohya | 361/794 |
| 5,190,892 A | * | 3/1993 | Sano | 438/670 |
| 5,480,048 A | * | 1/1996 | Kitamura et al. | 216/13 |

FOREIGN PATENT DOCUMENTS

JP           61091998 A    *    5/1986

* cited by examiner

Primary Examiner—Ori Nadav
(74) Attorney, Agent, or Firm—Keating & Bennett, LLP

(57) ABSTRACT

In the production of a high frequency circuit chip in which a wiring pattern is disposed on a substrate having a through-hole, a connecting electrode of the through-hole is formed by filling electrically conductive paste into a perforation and firing it, and the wiring pattern is formed by a lift-off method. Moreover, at least the surface of the substrate for the wiring pattern to be formed thereon is mirror-polished, and thereafter, the wiring pattern is formed on the mirror-polished surface by the lift-off method.

17 Claims, 7 Drawing Sheets

US 6,838,377 B2

HIGH FREQUENCY CIRCUIT CHIP AND METHOD OF PRODUCING THE SAME

BACKGROUND OF THE INVENTION

1. Field of the Invention

The present invention relates to a circuit chip, and, more particularly, to a high frequency circuit chip used in a multi-chip module (MCM) which operates in the microwave and millimeter wave bands, and a method of producing such a high frequency circuit chip.

2. Description of the Related Art

An example of a conventional high frequency circuit chip (passive circuit chip) used in multi-chip modules (MCM) which operate in the microwave and millimeter wave bands, is shown in FIG. 6.

The high frequency circuit chip includes lumped constant elements such as a wiring pattern 52 (such as a distributed constant line or a microstrip line), a meander inductor 53, an interdigital capacitor 54, and a thin film resistor 55 disposed on the upper surface (the front surface) of a substrate 51, a back-surface electrode (conductor layer) 56 provided substantially on the entire lower surface (back surface) of the substrate 51, and a through hole 57 which connects the wiring pattern 52 provided on the front surface of the substrate 51 and the back-surface electrode (conductor layer) 56 to each other.

In the high frequency circuit chips of the related art, conductor patterns used as the wiring pattern 52, the meander inductor 53, and the interdigital capacitor 54, for example, are commonly formed by printing electrically conductive paste such as Ag paste and Cu paste and firing, or by wet-etching Au plating films having a thickness of 2 $\mu$m to 5 $\mu$m). The minimum line width of wiring patterns formed by printing is 100 $\mu$m, and that obtained by etching is 20 $\mu$m.

As the substrate 51 in the high frequency circuit chip shown in FIG. 6, a Teflon substrate ($\epsilon$r: 2 to 3) and an alumina substrate ($\epsilon$r: about 10) are commonly used. To reduce the size of the high frequency circuit chip, a ceramic substrate made of barium titanate or other suitable material as a major raw material, having a high dielectric constant, and to operate in the microwave band is effectively used. However, to produce the most accurate wiring pattern, the dimensional precision and the shape accuracy, the aforementioned Teflon or alumina substrate is used.

Moreover, in the high frequency circuit chip of the related art, a perforating through-hole 57a is provided in some cases, and a filled through-hole 57b is provided in other cases. The perforating through-hole 57a is provided by perforating the substrate by laser beam processing or other suitable method, and then, providing an electrode film 59 on the inner wall of the perforation 58 by sputtering or vacuum deposition as shown in FIG. 7, whereby the front and back surfaces of the substrate are electrically connected to each other, as shown in FIG. 7. The filled through-hole 57b in which a filling electrode 60 is embedded into the perforation 58 is provided by plating or filling electrically conductive paste as shown in FIG. 8.

In the aforementioned high frequency circuit chip, the wiring pattern is commonly formed by printing or etching. As described above, the minimum line width of wiring patterns is 100 $\mu$m when printing is used, and is 20 $\mu$m when etching is used. Recently, the size of electronic devices has decreased. Thus, wiring patterns having reduced line widths are required.

To provide wiring patterns having reduced line widths, reactive ion etching (RIE), ion milling methods, and other suitable methods are used. However, the apparatuses required for reactive ion etching and ion milling are expensive and, moreover, the substrates are chemically damaged, which deteriorates the electrical characteristics of such chips.

In high frequency circuit chips having a perforating through-hole 57a type (FIG. 7), a resist cannot be uniformly coated, which makes it difficult to form a fine wiring pattern.

Moreover, in high frequency circuit chips having a filled through-hole 57b (FIG. 8) the electrode 60 filled into the through-hole 57b is convex or concave with respect to the main surfaces of the substrate 51, which makes it difficult to uniformly coat a resist and form a fine wiring pattern.

Au of which the resistance is low is generally used for the wiring pattern 52, the electrode film 59 or the filled electrode 60 of the through-hole. However, Au is expensive which substantially increases the cost of the product.

SUMMARY OF THE INVENTION

In order to overcome the above-described problems, preferred embodiments of the present invention provide a high frequency circuit chip having a decreased size and a fine, high precision wiring pattern, and a method of efficiently producing the same.

According to a preferred embodiment of the present invention, a method of producing a high frequency circuit chip having a substrate made of a ceramic with a high dielectric constant, a wiring pattern provided on one main surface of the substrate, an electric conductor layer provided on substantially the entire other main surface of the substrate, and a through-hole including a connecting electrode to connect the wiring pattern and the conductor layer to each other is provided, the method including the steps of filling electrically conductive paste into a perforation in the substrate, and firing the paste to form the connecting electrode of the through-hole, and forming a resist pattern with an opening having a desired shape and size on the substrate, forming a thin film with a wiring material on the substrate through the opening over the resist pattern, and removing the unnecessary wiring material thin film deposited on the resist pattern together with the resist pattern to form the wiring pattern on the substrate by a lift-off method.

As described above, in the production of the high frequency circuit chip having the substrate made of the ceramic material with a high dielectric constant, the wiring pattern provided on one main surface of the substrate, the electric conductor layer provided on substantially the entire other main surface of the substrate, and the through-hole having the electrode to connect the wiring pattern and the conductor layer to each other, the connecting electrode of the through-hole is formed by filling the electrically conductive paste into the perforation and then firing the same. Therefore, the through-hole having the connecting electrode is efficiently formed. Moreover, during the manufacturing process, the wiring pattern is formed by the lift-off method. Accordingly, the wiring pattern having a reduced line width is formed with high precision. The size of the high frequency circuit chip is greatly reduced without substantially increasing the cost.

Specifically, the method of producing a high frequency circuit chip according to the first preferred embodiment of the present invention includes the steps of (1) forming a hole (perforation) passing through the substrate made of the ceramic with a high dielectric constant, extending from the front side to the back side thereof, (2) filling the conductive paste in the through-hole, (3) firing the substrate having the through-hole filled with the conductive paste, (4) forming the conductor layer on substantially all of one main surface of the fired substrate, (5) forming the circuit pattern on the other main surface of the substrate by the lift-off method, and (6) cutting the substrate along a dicing line to obtain the high frequency circuit chip. The present invention is not limited to the aforementioned preferred embodiment. Various changes can be made in the sequence of the processes according to the present invention.

The conductor layer is preferably formed by applying and firing electrically conductive paste.

Since the conductor layer is preferably formed by applying the conductive paste and firing it, the conductor layer is efficiently provided on the other main surface of the substrate, without requiring large, complicated equipment, in contrast to forming a thin film electrode.

According to a second preferred embodiment of the present invention, a method of producing a high frequency circuit chip having a substrate made of a ceramic material with a high dielectric constant, wiring patterns provided on each of the front and back main surfaces of the substrate, and a through-hole including a connecting electrode for connecting the wiring patterns provided on the front and back main surfaces of the substrate, is provided which includes the steps of filling electrically conductive paste into a perforation in the substrate, and firing the paste whereby the connecting electrode of the through-hole is formed, and forming a resist pattern with an opening having a desired shape and size on the substrate, forming a thin film with a wiring material on the substrate through the opening over the resist pattern after forming the resist pattern, and removing the unnecessary wiring material thin film deposited on the resist pattern together with the resist pattern to form each wiring pattern on the substrate by the lift-off method.

As described above, the connecting electrode of the through-hole is formed by filling the electrically conductive paste into the perforation in the substrate, and firing it. Thus, the through-hole having the connecting electrode is efficiently formed. Moreover, the wiring pattern is formed by the lift-off method. Therefore, the wiring pattern having a reduced line width is formed with high precision. Accordingly, the size of the high frequency circuit chip is greatly reduced without substantially increasing the cost thereof. Furthermore, since the high frequency circuits are formed on both of the surfaces of the substrate, the integration degree of the circuit is further improved, and the size of the product is further reduced.

Specifically, the method of producing a high frequency circuit chip according to the second preferred embodiment of the present invention includes the steps of (1) forming a hole (the perforation) passing through the substrate made of the ceramic with a high dielectric constant, extending from the front side to the back side thereof, (2) filling the conductive paste into the through-hole, (3) firing the substrate having the through-hole filled with the conductive paste, (4) forming the conductor layer on substantially all of one main surface of the fired substrate by the lift-off method, (5) forming a circuit pattern on the other main surface of the substrate by the lift-off method, and (6) cutting the substrate along a desired dicing line to obtain a high frequency circuit chip. The present invention is not limited to the aforementioned preferred embodiments. Various changes can be made to the present invention with respect to the sequence of the processes.

The methods of preferred embodiments of the present invention preferably include forming a protection film to cover the wiring pattern on the substrate, and thereafter, cutting the substrate along desired dicing lines to obtain the high frequency circuit chip.

By forming the protection film to protect the wiring pattern, and thereafter, cutting the substrate, the wiring pattern is prevented from being damaged during the process in which the substrate is cut and in the future when the product is used. Thus, a high frequency circuit chip having a high reliability is obtained.

Preferably, each method of producing a high frequency circuit chip further includes a step of forming a thin-film resistor pattern which is connected to the wiring pattern.

Since the method of preferred embodiments of the present invention preferably includes the step of forming the thin-film resistor pattern connected to the wiring pattern, the high frequency circuit chip having the resistor which is a passive element is efficiently produced. The thin-film resistor pattern may be formed before or after the wiring pattern is formed.

Preferably, the method of preferred embodiments of the present invention includes mirror-polishing at least the surface of the fired substrate on which the wiring pattern is formed, and the fired substrate in which the through-hole having the connecting electrode is formed, and thereafter forming the wiring pattern on the mirror-polished surface by the lift-off method.

As described above, regarding the fired substrate having the through-hole with the connecting electrode, at least the surface thereof on which the wiring pattern is formed is mirror-polished, and thereafter, the wiring pattern is preferably formed on the mirror-polished surface by the lift-off method. Thereby, the resist is uniformly coated onto the smooth surface of the substrate, and the high precision resist pattern is securely formed thereon. Thus, the wiring pattern having a reduced line width and outstanding shape and size precision is efficiently formed. The density of the wiring is also greatly improved.

According to the methods of preferred embodiments of the present invention, preferably, the substrate has a relative dielectric constant of at least about 10.

Since the substrate having a dielectric constant of at least about 10 is used, the electrostatic capacitance of the high frequency circuit chip obtained when it is provided with a capacitor is greatly increased, and thus, the size of the product is further reduced.

Preferably, the method of preferred embodiments of the present invention includes forming (a) the wiring pattern provided on at least one main surface of the substrate and the electric conductor layer provided on substantially the entire other main surface, or (b) the wiring patterns provided on both of the front and back main surfaces of the substrate, by conductor patterns each containing at least one metal selected from the group consisting of Ag, Cu, and Al as a major component and having a thickness of at least about 2 $\mu$m.

As described above, (a) the wiring pattern provided on at least one main surface of the substrate and the electric conductor layer provided on substantially the entire other main surface, or (b) the wiring patterns provided on both of the front and back main surfaces of the substrate, are formed by the conductor patterns each including at least one metal selected from the group consisting of Ag, Cu, and Al as a major component and having a thickness of at least about 2 $\mu$m. Thereby, the high frequency circuit chip having low wiring resistance, low loss, and being economically produced is obtained.

According to the methods of preferred embodiments of the present invention, preferably, the connecting electrode of the through-hole is formed using electrically conductive paste containing at least one metal selected from the group consisting of Ag, Cu, and Al as a major component.

By forming the connecting electrode of the through-hole by electrically conductive paste containing at least one metal selected from the group consisting of Ag, Cu, and Al as a major component, the high frequency circuit chip provided with the through-hole having outstanding reliability is efficiently produced without substantially increasing the cost thereof.

According to preferred embodiments of the present invention, a high frequency circuit chip is produced by one of the aforementioned methods, and includes the substrate containing as a major component the ceramic with a high dielectric constant, the wiring pattern provided on one main surface of the substrate by the lift-off method, the conductor layer provided on substantially the entire other main surface of the substrate, and the through-hole provided in the substrate, the through-hole including the connecting electrode for connecting the wiring pattern and the electric conductor layer.

As described above, in the high frequency circuit chip of other preferred embodiments of the present invention which is produced by one of the aforementioned methods, the wiring pattern has a greatly reduced line width that is formed with outstanding precision. Accordingly, the high frequency circuit chip has a density of the wiring that is greatly improved, a greatly reduced size, and outstanding reliability.

Moreover, according to preferred embodiments of the present invention, a high frequency circuit chip which is produced by one of the aforementioned methods includes a substrate containing as a major component the ceramic with a high dielectric constant, the wiring pattern provided on each of the front and back main surfaces of the substrate by the lift-off method, and the through-hole provided in the substrate, the through-hole including the connecting electrode to connect the wiring patterns provided on both of the front and back surfaces of the substrate to each other.

As described-above, the high frequency circuit chip is produced by one of the aforementioned methods, and is provided with the wiring patterns which are formed by the lift-off method, having a greatly reduced line width that is produced with outstanding precision. Thus, the high frequency circuit chip having a greatly reduced size and outstanding reliability is provided. Moreover, since the high frequency circuits are provided on both of the major surfaces of the substrate, the integration degree of the circuit is further improved, and the size of the product is further reduced.

Preferably, in the high frequency circuit chip, at least the surface(s) of the substrate on which the wiring pattern is provided is mirror-polished.

Since the surface (or surfaces) of the substrate having the wiring pattern is mirror-finished, and the wiring pattern is provided on the highly-smooth surface with high precision and high density. Thus, the line width of wiring pattern is further reduced, and the size of the high frequency circuit chip is further reduced.

Preferably, in the high frequency circuit chip of preferred embodiments of the present invention, the substrate has a dielectric constant of at least about 10.

Since the substrate has a dielectric constant of at least about 10, the electrostatic capacitance of the high frequency circuit obtained when provided with a capacitor is increased, and the size of the product is greatly reduced.

Preferably, in the high frequency circuit chip of preferred embodiments of the present invention, (a) the wiring pattern provided on at least one main surface of the substrate and the electric conductor layer provided on substantially the entire other main surface, or (b) the wiring pattern provided on each of the front and back main surfaces of the substrate include at least one metal selected from the group consisting of Ag, Cu, and Al as a major component, and have a thickness of at least about 2 $\mu$m.

As described above, (a) the wiring pattern and the electric conductor layer, or (b) the wiring pattern includes at least one metal selected from the group consisting of Ag, Cu, and Al as a major component, and has a thickness of at least about 2 $\mu$m. Thus, the high frequency circuit chip having low wiring resistance and low loss is very economical obtained.

Preferably, the connecting electrode of the through-hole includes at least one metal selected from the group consisting of Ag, Cu, and Al as a major component.

Since the connecting electrode of the through-hole preferably includes at least one metal selected from the group consisting of Ag, Cu, and Al as a major component, the high frequency circuit chip is inexpensive, and has outstanding connecting reliability.

Other features, elements, characteristics and advantages of the present invention will be clear from the following detailed description of preferred embodiments of the present invention in conjunction with the accompanying drawings.

DETAILED DESCRIPTION OF PREFERRED EMBODIMENTS

Hereinafter, the features of the present invention will be described with reference to preferred embodiments of the present invention.

Figure 1:
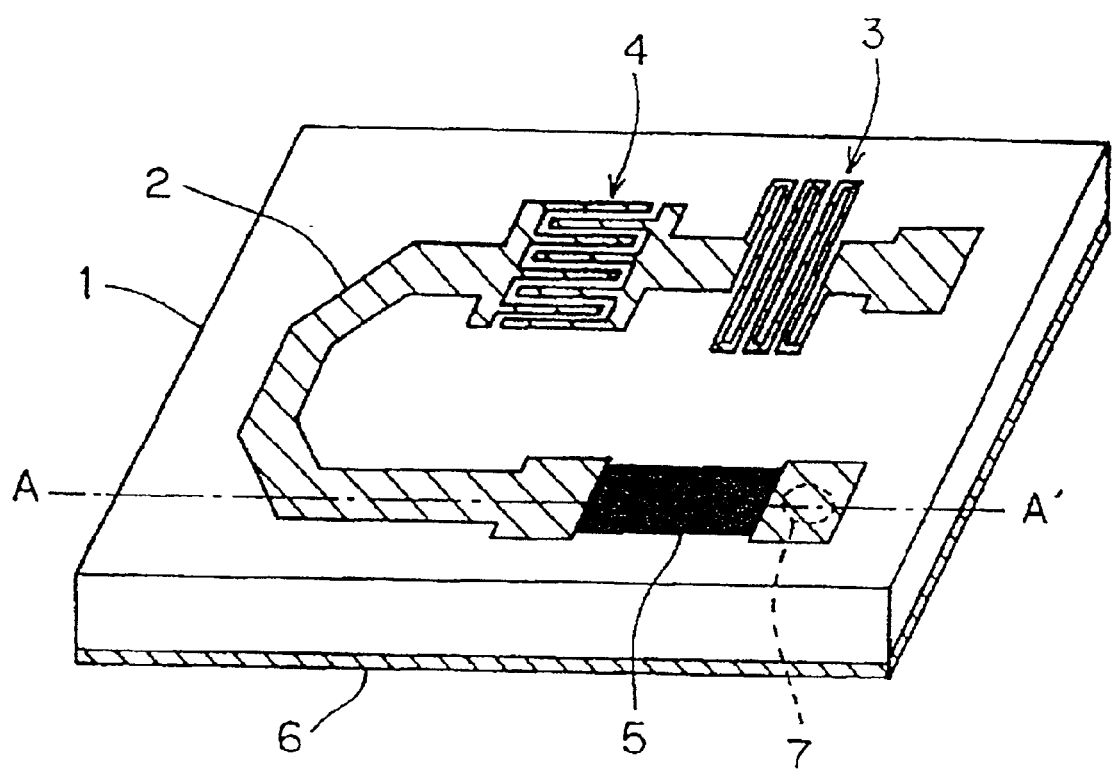
FIG. 1 is a schematic perspective view showing a high frequency circuit chip according to a first preferred embodiment of the present invention.

FIG. 1 shows a high frequency circuit chip according to a first preferred embodiment of the present invention. The high frequency circuit chip includes a wiring pattern (e.g., a distributed constant line or a microstrip line) 2 provided on the upper surface (front surface) of a substrate 1, lumped constant elements such as a meander-shaped inductor 3, an interdigital capacitor 4, a thin film resistor 5, and other suitable elements, and a through-hole 7 which connects the wiring pattern 2 provided on the front surface of the substrate 1 and a back-surface electrode (conductor layer) 6 provided on the back surface of the substrate 1 to each other.

Hereinafter, a method of producing a high frequency circuit chip according to the first preferred embodiment of the present invention will be described.

(1) First, a perforation 11 (FIG. 2B) for a through-hole is formed in the substrate 1 (FIG. 2A) made of barium titanate as a raw material, having a high dielectric constant ($\epsilon r > 10$), and to operate in the microwave band by a laser.

The perforation 11 may be formed before the substrate 1 is fired, and thereafter, the substrate 1 is fired. On the other hand, the perforation 11 may be formed in the substrate 1 after firing.

(2) Next, electrically conductive paste 12 containing Ag as a major component is printed so as to be filled into the perforation 11, and is fired at about 800° C. Thus, the through-hole 7 having an electrode 7a for connection is formed, as shown in FIG. 2C.

Figure 2:
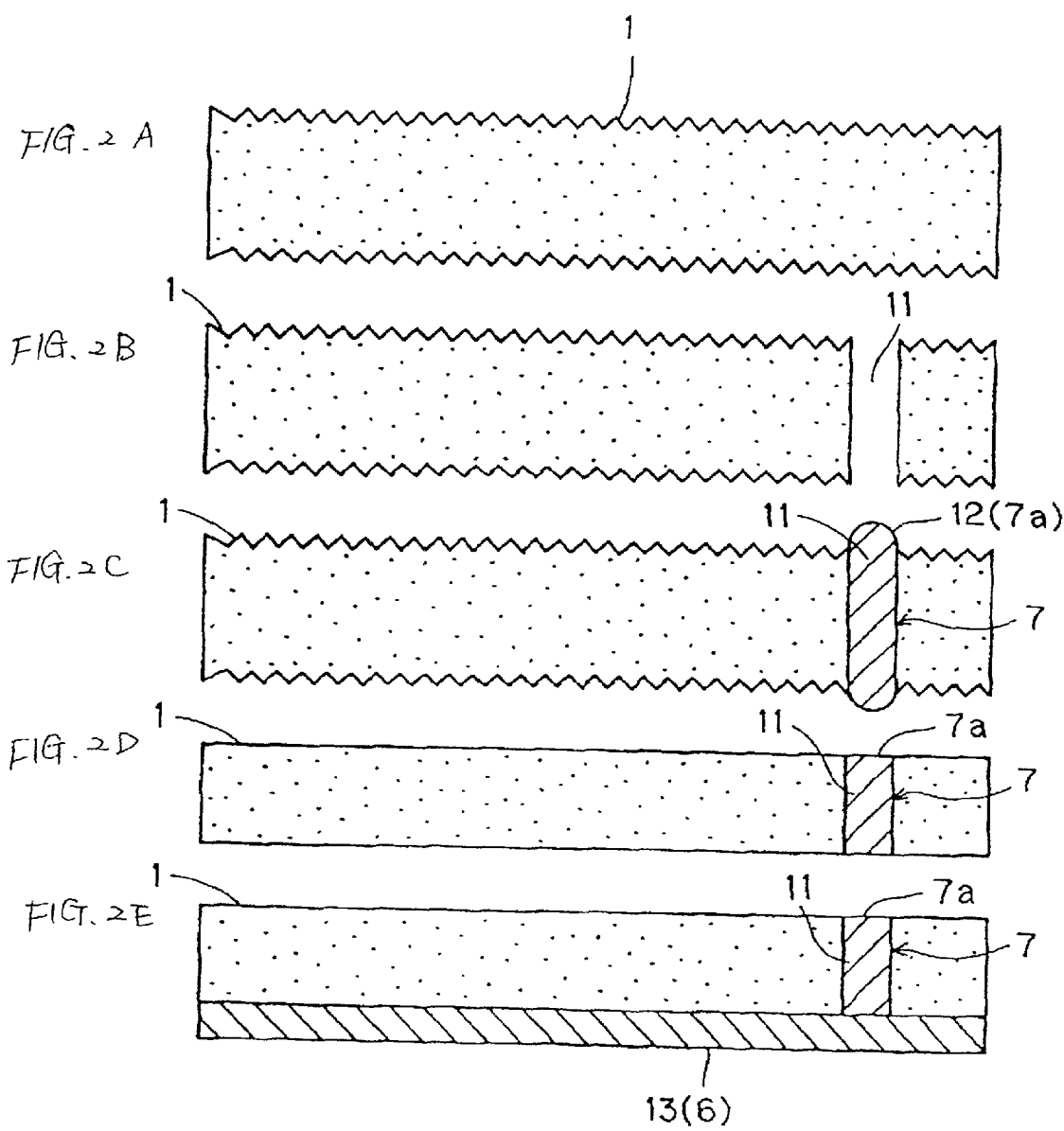
FIGS. 2A to 2E are cross-sectional views illustrating a method of producing the high frequency circuit chip of the first preferred embodiment of the present invention and taken along line A–A' in FIG. 1.

(3) Thereafter, both of the front and back main surfaces of the substrate 1 are mirror-polished (FIG. 2D).

(4) Subsequently, electrically conductive paste 13 containing Ag as a major component (the same as the electrically conductive paste 12 used to form the connection electrode 7a) is coated on the entire back surface (under surface) of the substrate 1, and is fired at about 800° C. Thus, a conductor layer 6 is formed on the entire back-surface (under surface) of the substrate 1 (FIG. 2E).

Figure 3:
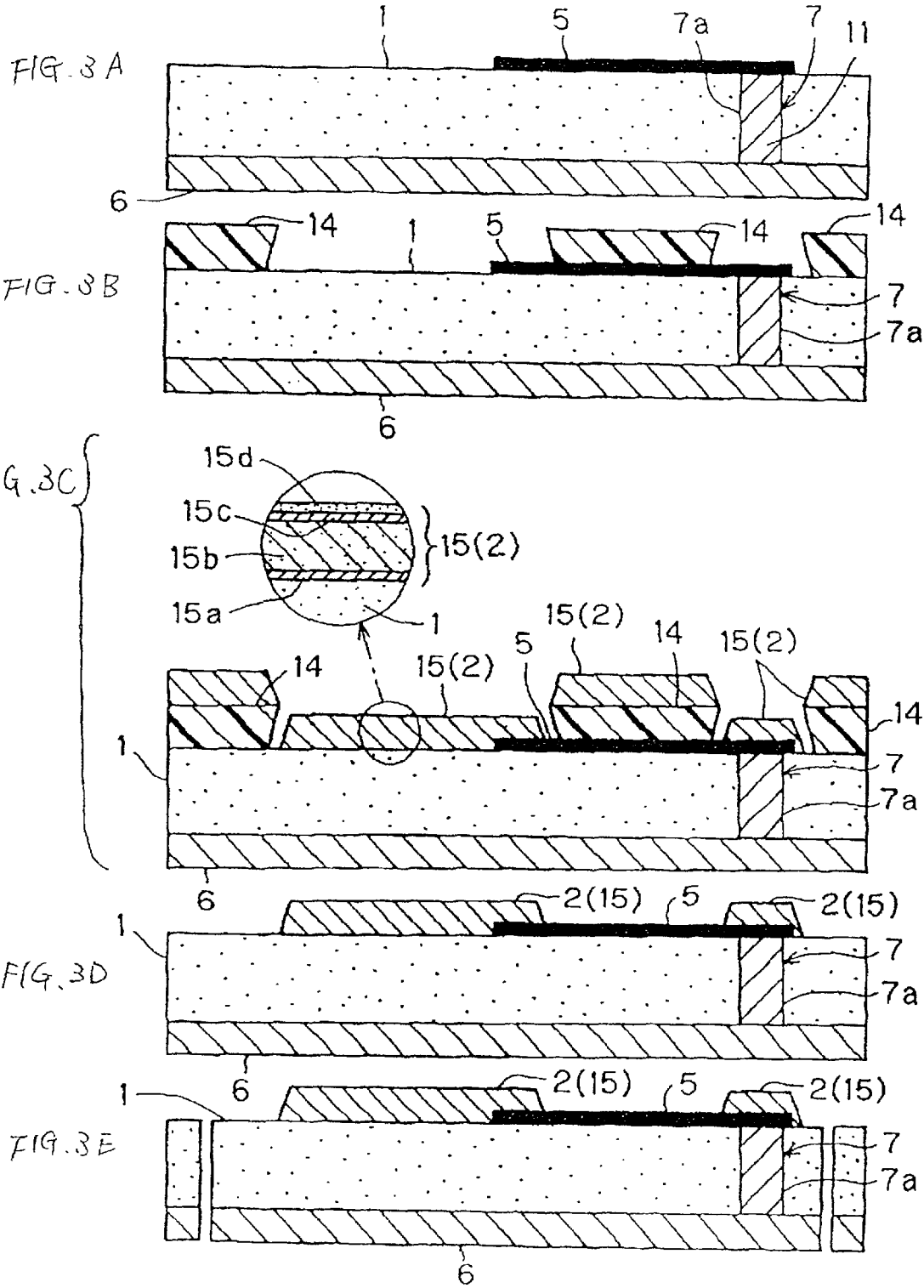
FIGS. 3A to 3E are cross-sectional views illustrating the method of producing the high frequency circuit chip of the first preferred embodiment of the present invention and taken along line A–A' in FIG. 1.

(5) Thereafter, as shown in FIG. 3A, the thin film resistor 5 made of tantalum nitride or other suitable material is formed on the front surface (upper surface) of the substrate 1 by sputtering. Then, the thin film resistor 5 having a desired pattern is formed by photolithography and etching.

(6) Next, as shown in FIG. 3B, a resist (pattern) 14 for lift-off is formed by photolithography so as to have an opening (wiring-pattern formation area) therein in which the wiring pattern is formed, the edge of the opening having an over-hang shape.

(7) Thereafter, as shown in FIG. 3C, a plurality of electrode layers to define the wiring pattern 2 (FIG. 1), that is, an NiCr film (film thickness of about 0.04 $\mu$m) 15a, a Cu film (film thickness: about 5 $\mu$m) 15b, a Pd film (film thickness of about 0.15 $\mu$m) 15c, and an Au film (film thickness of about 0.3 $\mu$m) 15d of the first preferred embodiment are sequentially formed. Thus, a metal film (thin film as a wiring material) 15 having a multi-layer structure is formed.

In this case, the vapor deposition particles collide with the substrate 1 substantially perpendicularly thereto such that the wiring pattern (metal film) 2 deposited onto the substrate 1 is not connected with the metal film 15 deposited on the resist 14.

The high frequency circuit chip of the first preferred embodiment is configured such that the NiCr film 15a functions as an adhesion layer for the substrate 1, the Cu film 15b as a major conductor layer, the Au film 15d as a wire-bonding layer, and the Pd layer 15c as a buffer layer for suppressing the Au of the Au film 15d and the Cu of the Cu film 15b from interdiffusing, respectively.

(8) Thereafter, as shown in FIG. 3D, the substrate 1 is dipped into an organic solvent such as acetone, such that the resist 14 and the metal film 15 deposited on the resist 14 are lifted off and removed. Thus, the metal film 15 (namely, the wiring pattern 2) is deposited only in the region on the substrate 1 where the wiring pattern 2 are formed.

(9) Thereafter, the substrate 1 is dipped into a rust inhibiting agent (e.g., BT-8 manufactured by Kitaike Sangyo Co., Ltd.), and is dried, such that the Cu of the Cu film 15b exposed on the sides of the wiring pattern 2 is converted to the chelate compound. Thus, the substrate is treated such that oxidation of the Cu is prevented. Furthermore, to protect the Cu surface of the Cu film 15b, formation of a coating film, using a fluorine-type coating material is applied.

(10) Next, the substrate 1 is cut along desired dicing lines with a dicing saw or other suitable device, such that unnecessary portions of the substrate 1 are removed (FIG. 3E), and the high frequency circuit chips (passive circuit chips) are individually separated. Thus, as shown in FIG. 1, the high frequency circuit chip is obtained, which includes the wiring pattern 2 which is formed, by the lift-off method, on one main surface of the substrate 1 made of a ceramic having a high dielectric constant, the conductor layer 6 which is formed by coating the electrically conductive paste 13 on substantially the entire other main surface of the substrate 1, and firing the paste 13, and the through-hole 7 having the connecting electrode 7a which connects the wiring pattern 2 and the conductor layer 6 to each other.

The wiring pattern 2 is preferably protected by providing an additional process in which a protection film for protecting the wiring pattern 2 is formed on the surface of the substrate 1 before the substrate 1 is cut. Accordingly, a high frequency circuit chip having outstanding reliability is produced by using an inexpensive wiring material.

The following operation and effects are provided according to the method of producing a high frequency circuit chip of the first preferred embodiment of the present invention.

(a) Since the conductive paste is filled into the through-hole and fired, and thereafter, the substrate is mirror-polished, the resist is uniformly coated on the flat surface of the substrate. Accordingly, a fine resist pattern is easily formed.

(b) Since the wiring pattern is formed by the lift-off method, side etching of the wiring pattern, as occurs when wet-etching of the related art is carried out, is prevented. Thus, a wiring pattern having a relatively large film-thickness (about 2 $\mu$m to about 5 $\mu$m) is formed while having a reduced line width (line width of about 5 $\mu$m,. precision of about ±1 $\mu$m).

(c) Since the substrate is not exposed to an etchant, gases, and plasma, the substrate is not damaged, such that a high frequency circuit chip having superior characteristics is obtained.

(d) Since the filled through-hole and the conductor layer on the back surface of the substrate, which do not particularly require a line precision, is formed using Ag paste, and moreover, Cu is used as the main conductor constituting the wiring pattern having a multi-layer structure, an inexpensive high frequency circuit chip having low loss is obtained.

Figure 5:
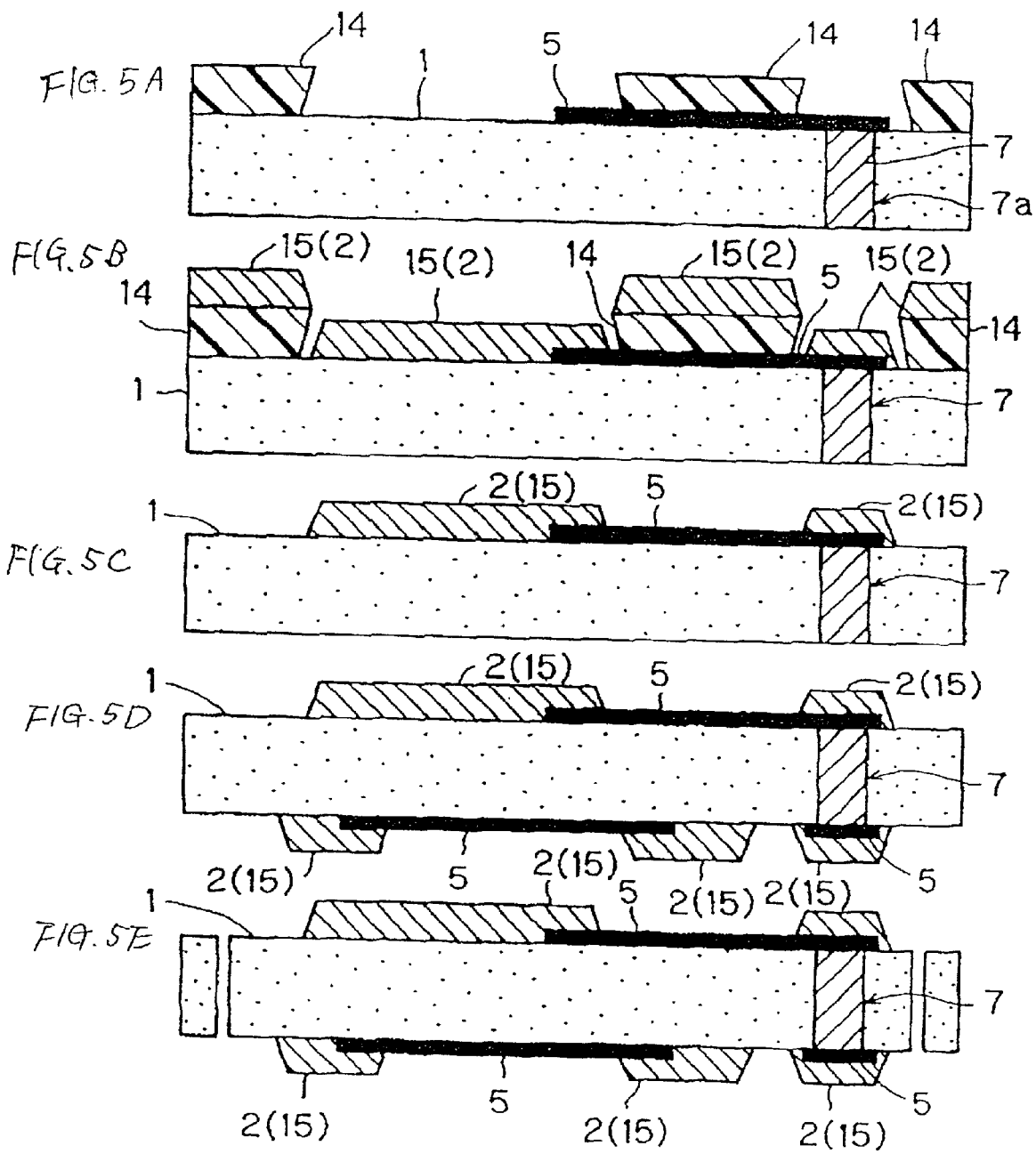
FIGS. 5A to 5E illustrate the method of producing a high frequency circuit chip according to the second preferred embodiment of the present invention.
Figure 6:
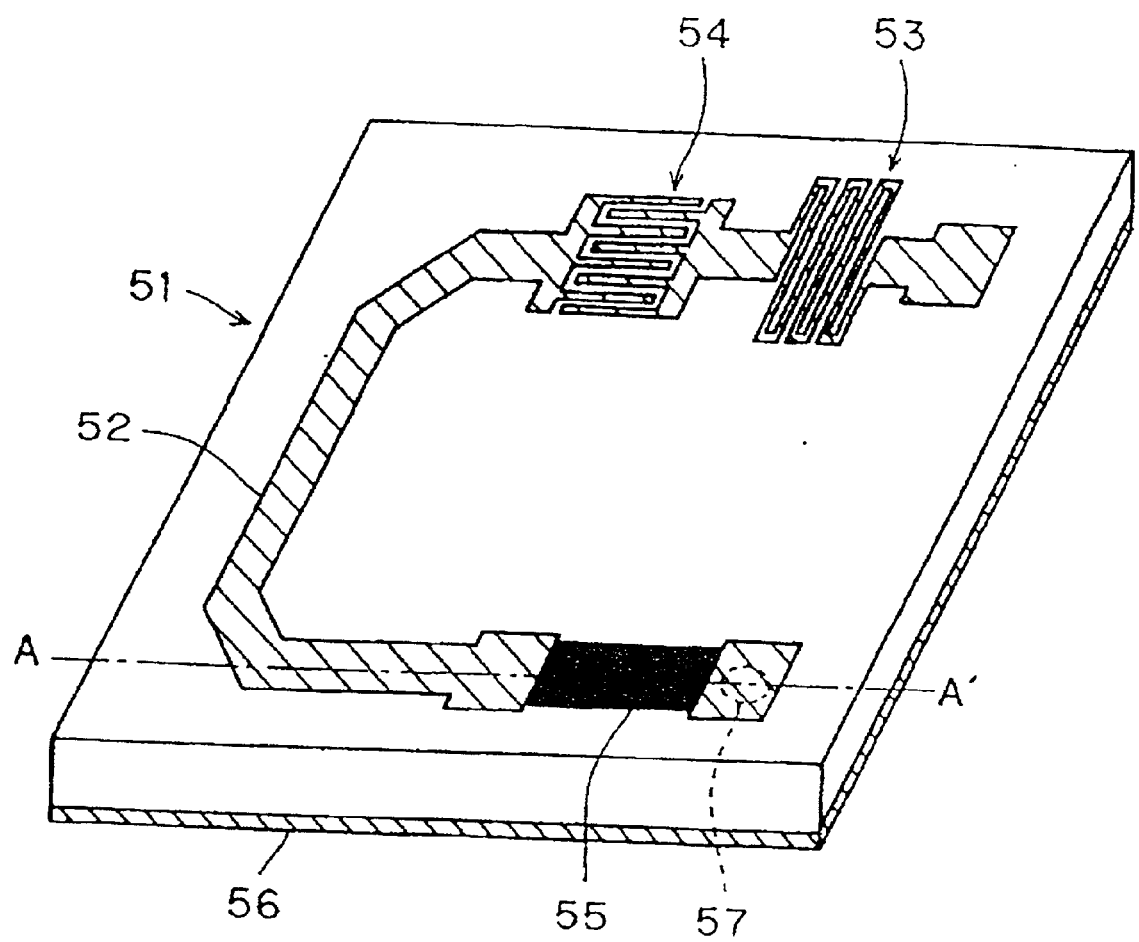
FIG. 6 is a schematic perspective view of a high frequency circuit chip of the related art.
Figure 7:
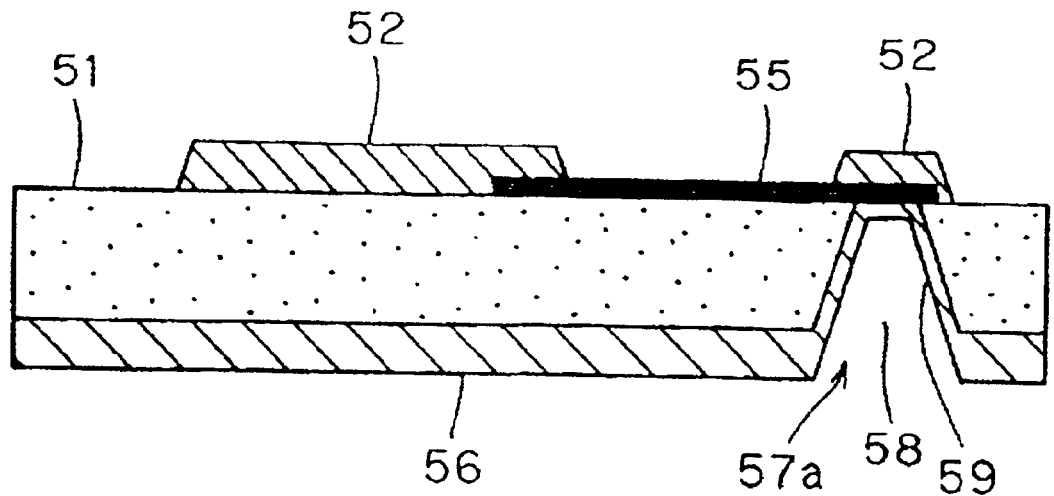
FIG. 7 are cross-sectional views showing an example of the structure of the through-hole of the high frequency circuit chip of the related art and taken along line A–A' in FIG. 6.
Figure 8:
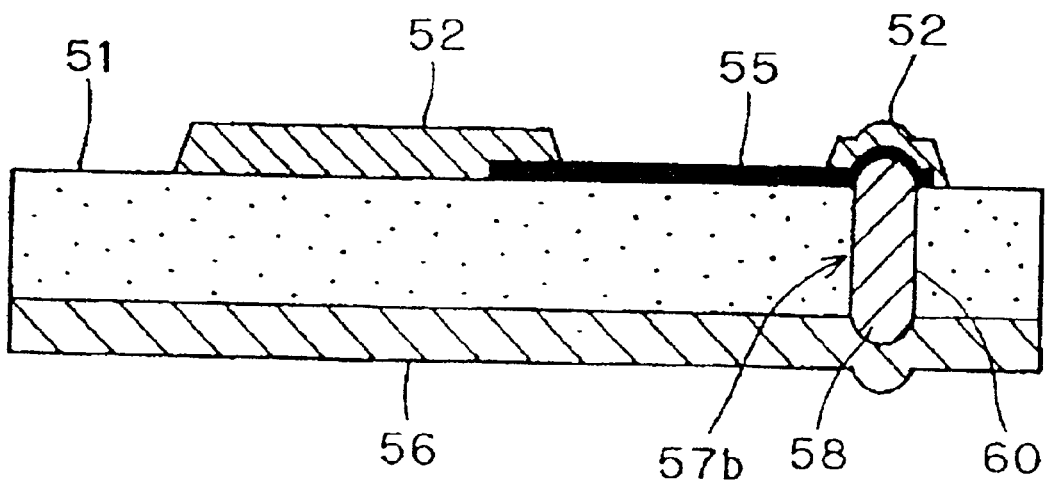
FIG. 8 are cross-sectional views showing another example of the structure of the through-hole of the high frequency circuit chip of the related art and taken along line A–A' in FIG. 6.

A second preferred embodiment of the present invention provides a high frequency circuit chip having a high frequency circuit including the wiring pattern 2, the thin film resistor 5, and other suitable elements formed on the back surface (under surface) of the substrate 1 in addition to the high frequency circuit provided on the front surface (upper surface) of the substrate 1, as shown in FIG. 5E. The high frequency circuit chip of the second preferred embodiment has the same configuration as that of the first preferred embodiment except that the high frequency circuit is provided on the back surface (under surface) of the substrate 1 in addition to that formed on the front surface (upper surface) of the substrate 1. Thus, the repeated description of the same configuration is omitted.

Hereinafter, the method of producing a high frequency circuit chip according to the second preferred embodiment will be described.

(1) First, the perforation 11 (FIG. 4B) for the through-hole is formed in the substrate 1 (FIG. 4A) made of barium titanate as a raw material, having a high dielectric constant ($\epsilon r > 10$), and to operate in the microwave band by a laser or other suitable method.

The perforation 11 may be formed before the substrate 1 is fired, and thereafter, the substrate 1 is fired. On the other hand, the perforation 11 may be formed in the substrate 1 after firing.

Figure 4:
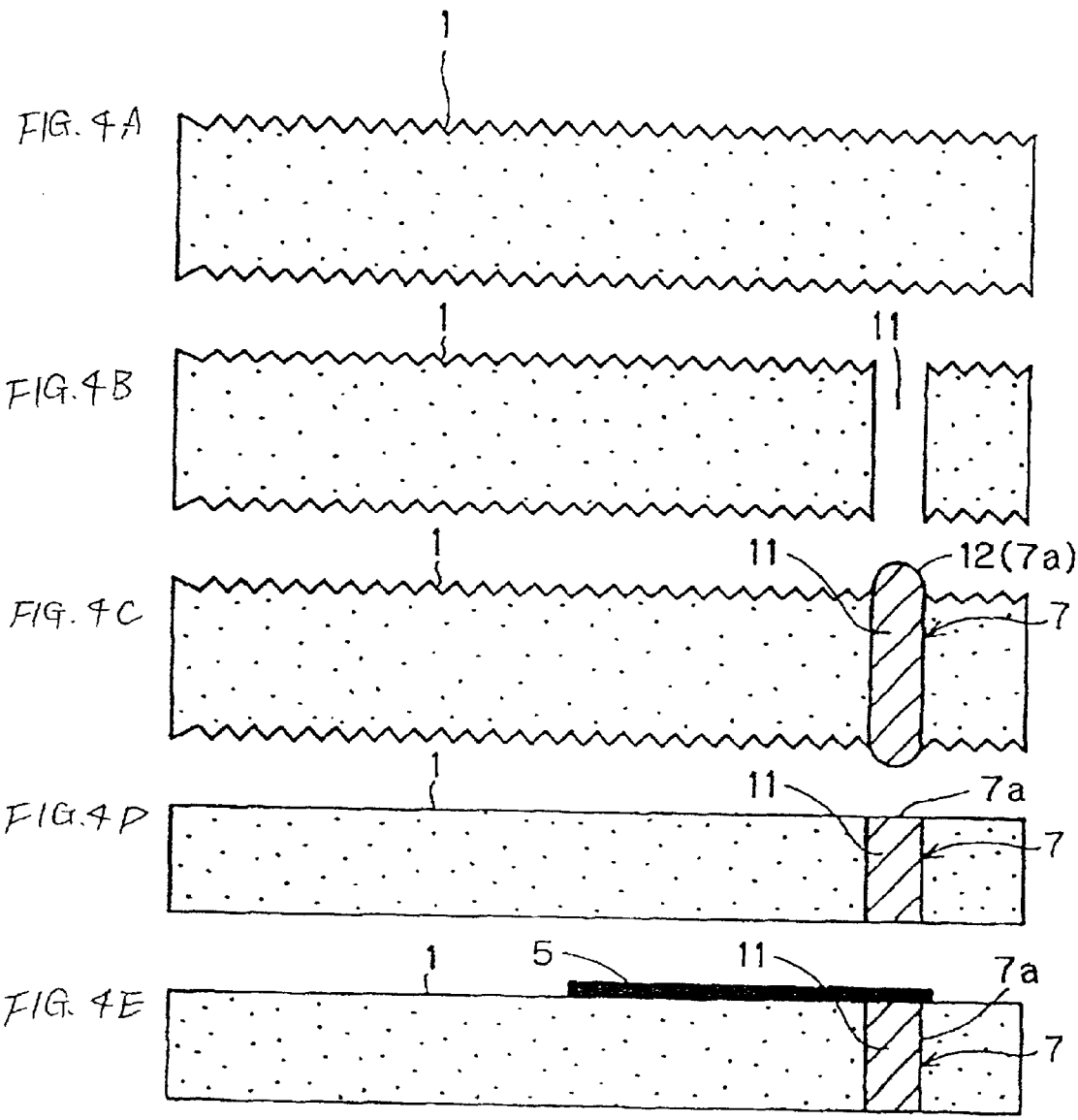
FIGS. 4A to 4E illustrate a method of producing a high frequency circuit chip according to a second preferred embodiment of the present invention.

(2) Next, the electrically conductive paste 12 containing Ag as a major component is printed so as to be filled into the perforation 11, and is fired at about 800° C. as shown in FIG. 4C. Thus, the through-hole 7 having the electrode 7a for connection is formed, as shown in FIG. 4C.

(3) Thereafter, both of the front and back main surfaces of the substrate 1 are mirror-polished (FIG. 4D).

(4) Thereafter, as shown in FIG. 4E, the thin film resistor 5 made of tantalum nitride or other suitable material is formed on the front surface (upper surface) of the substrate 1 by sputtering. Then, the thin film resistor 5 having a desired pattern is formed by photolithography and etching.

(5) Next, as shown in FIG. 5A, the resist (pattern) 14 for lift-off is formed by photolithography so as to have an opening (wiring-pattern formation area) therein in which the wiring pattern is formed, the edge of the opening having an over-hang configuration.

(6) Thereafter, as shown in FIG. 5B, a plurality of electrode layers for constituting the wiring pattern 2 (FIG. 1), that is, the NiCr film (film thickness of about 0.04 $\mu$m), the Cu film (film thickness of about 5 $\mu$m), the Pd film (film thickness of about 0.15 $\mu$m) 15c, and the Au film (film thickness of about 0.3 $\mu$m) of the second preferred embodiment are sequentially formed as shown in FIG. 5B. Thus, the metal film (thin film of a wiring material) 15 having a multi-layer structure is formed.

In this case, the vapor deposition particles collide with the substrate 1 substantially perpendicularly thereto such that the wiring pattern (metal film) 2 deposited onto the substrate 1 is not connected to the metal film 15 deposited on the resist 14.

The second preferred embodiment is configured such that the NiCr film functions as an adhesion layer for the substrate 1, the Cu film as a major conductor layer, the Au film as a wire-bonding layer, and the Pd layer as a buffer layer for suppressing interdiffusion of the Au of the Au film 15d with the Cu of the Cu film 15b.

(7) Thereafter, as shown in FIG. 5C, the substrate 1 is dipped into an organic solvent such as acetone, such that the resist 14 and the metal film 15 deposited on the resist 14 are lifted off and removed. Thus, the metal film 15 (namely, the wiring pattern 2) is deposited only in the region on the substrate 1 where the wiring pattern 2 is formed.

(8) Subsequently, as shown in FIG. 5D, the thin film resistor pattern 5 and the wiring pattern 2 are formed on the back surface of the substrate 1 by the same processing as described in the aforementioned Articles (4) to (7).

(9) Thereafter, the substrate 1 is dipped into a rust inhibiting agent (e.g., BT-8 manufactured by Kitaike Sangyo Co., Ltd.), and is dried, such that the Cu of the Cu film exposed to the sides of the wiring pattern 2 is converted to the chelate compound. Thus, the substrate 1 is treated such that oxidation of the Cu is prevented. Furthermore, to protect the surface of Cu, formation of a coating film using a fluorine-type coating material are applied.

(10) Next, the substrate 1 is cut along desired dicing lines by a dicing saw or other suitable device, such that unnecessary portions of the substrate 1 are removed (FIG. 5E), and the high frequency circuit chips (passive circuit chips) are individually separated. Thus, the high frequency circuit chip is obtained, which includes the wiring patterns 2 which are formed, by the lift-off method, on both of the front and back main surfaces of the substrate 1 containing a ceramic having a high dielectric constant as a major component, and the through-hole 7 having the connecting electrode 7a which connects the wiring patterns 2 on both of the front and back main surfaces of the substrate 1 to each other.

The wiring patterns 2 on the surfaces of the substrate 1 are preferably protected by performing an additional process in which protection films for protecting the wiring patterns 2 are formed on the surfaces of the substrate 1 before the substrate 1 is cut. Accordingly, the high frequency circuit chip having outstanding reliability is produced by using an inexpensive wiring material.

As described above, according to the method of producing a high frequency circuit chip of the second preferred embodiment, the same operation and effects as those of the first preferred embodiment are obtained, and moreover, the high frequency circuits are provided on both of the surfaces of the substrate 1. Thus, the circuit integration degree is further improved, such that the size of the product is further reduced.

The first and second preferred embodiments deal with the case in which the filled through-hole is formed by embedding the filling electrode into the perforation. In the present preferred embodiments of the present invention, the perforating through-hole in which the electrode film is formed on the inner wall of the perforation may be formed.

The present invention is not limited to the above-described preferred embodiments. It is to be understood that various changes may be made with respect to the type of ceramic having a high dielectric constant for constituting the substrate, the materials and specific arrangement of the wiring pattern, the thin film resistor, and the conductor film which constitute the high frequency circuit, and the material for the connecting electrode of the through-hole without departing from the sprit and scope of the invention.

As described above, in the method of producing a high frequency circuit chip in accordance with the first preferred embodiment of the present invention, the circuit chip having the substrate made of the ceramic with a high dielectric constant, the wiring pattern formed on one main surface of the substrate, the electric conductor layer formed on substantially the entire other main surface of the substrate, and the through-hole having the electrode for connecting the wiring pattern and the conductor layer to each other, the connecting electrode of the through-hole is formed by filling the electrically conductive paste into the perforation and firing the paste. Therefore, the through-hole having the connecting electrode is efficiently formed. Moreover, the wiring pattern is formed by the lift-off method. Thus, the line width of the wiring pattern is reduced and formed with outstanding precision. The size of the high frequency circuit chip is greatly reduced without substantially increasing the cost thereof.

Since the conductor layer is preferably formed by coating the conductive paste and firing it, the conductor layer is efficiently formed on the other main surface of the substrate without requiring large, complicated equipment, in contrast to the case in which a thin film electrode is formed.

According to the second preferred embodiment of the present invention, the connecting electrode of the through-hole is formed by filling the electrically conductive paste into the perforation in the substrate, and firing it. Thus, the through-hole having the connecting electrode is efficiently formed. Moreover, since the wiring pattern is formed by the lift-off method, the line width of the wiring pattern is reduced and produced with outstanding precision. Thus, the size of the high frequency circuit chip is greatly reduced without substantially increasing the cost thereof. Furthermore, since the high frequency circuits are formed on both of the surfaces of the substrate, the integration degree of the circuit is further enhanced, and the size of the product is further reduced.

Preferably, by forming the protection film for protecting the wiring pattern on the substrate, and thereafter, cutting the substrate along a predetermined dicing line, the wiring pattern can be prevented from being damaged during the process in which the substrate is cut and in the later stage where the product is used. Thus, the high frequency circuit chip having a high reliability can be obtained, even if an inexpensive wiring material is used.

Preferably, the methods according to preferred embodiments of the present invention further include the step of forming the thin-film resistor pattern connected to the wiring pattern. Thereby, the high frequency circuit chip having the resistor which is a passive element is efficiently produced.

Preferably, regarding the fired substrate having the through-hole with the connecting electrode, at least the surface thereof on which the wiring pattern is formed is mirror-polished, and thereafter, the wiring pattern is formed on the mirror-polished surface by the lift-off method. Thereby, the resist is uniformly coated onto the highly smooth surface of the substrate, and the high precision resist pattern is formed thereon. Thus, the line width of the wiring pattern is reduced and has outstanding precision of the shape and size thereof. The density of the wiring is also greatly improved.

By preferably using the substrate having a dielectric constant of at least about 10,the electrostatic capacitance of the high frequency circuit obtained when it is provided with a capacitor is greatly improved. Thus, the size of the product is greatly reduced.

Also, preferably, (a) as the wiring pattern formed on at least one main surface of the substrate and the electric conductor layer disposed on substantially the entire other main surface, or (b) the wiring pattern disposed on each of the front and back main surfaces of the substrate, the conductor pattern containing at least one metal selected from the group consisting of Ag, Cu, and Al as a major component and having a thickness of at last 2 $\mu$m is formed. Thereby, the high frequency circuit chip of which the wiring resistance is low, the loss is low, and which is economically advantageous can be obtained.

Since the connecting electrode of the through-hole is preferably formed using electrically conductive paste containing at least one metal selected from the group consisting of Ag, Cu, and Al as a major component, the high frequency circuit chip provided with the through-hole having a high reliability is efficiently produced without substantially increasing of the cost thereof.

The high frequency circuit chip of preferred embodiments of the present invention is produced by one of the aforementioned methods, and is provided with the wiring pattern which is formed by the lift-off method, has a reduced line width, and has outstanding precision. Therefore, the density of the wiring is greatly increased. Thus, the high frequency circuit chip of which the density of the wiring is greatly improved, the size is reduced, and the reliability is outstanding, is provided.

Moreover, the high frequency circuit chip of preferred embodiments of the present invention is produced by one of the aforementioned methods, and is provided with the wiring patterns which are formed by the lift-off method, has a reduced line width, and has a high precision. Thereby, the density of the wiring is greatly increased. Thus, the high frequency circuit chip having a greatly reduced size and outstanding reliability is provided. Moreover, since the high frequency circuits are formed on both of the surfaces of the substrate, the integration degree of the circuit is further improved, and the size of the product is further reduced.

In one of the high frequency circuit chips, the surface (or surfaces) of the substrate for the wiring pattern to be formed on is preferably mirror-polished. Accordingly, the wiring pattern is formed on the highly smooth surface with outstanding precision and high density. Thus, the wiring is formed with a further reduced line width, and the product is further reduced in size.

Since the substrate preferably has a dielectric constant of at least about 10, the electrostatic capacitance of the high frequency circuit obtained when it is provided with a capacitor is greatly increased. Thus, the size of the product is further reduced.

Moreover, in the high frequency circuit chips, (a) the wiring pattern and the electric conductor layer, or (b) the wiring patterns preferably include at least one metal selected from the group consisting of Ag, Cu, and Al as a major component, and also, has a thickness of at least about 2 $\mu$m. Thereby, the high frequency circuit chip of which the wiring resistance is reduced, the loss is reduced, and which is less expensive to manufacture is obtained.

Since the connecting electrode of the through-hole preferably includes at least one metal selected from the group consisting of Ag, Cu, and Al as a major component, the high frequency circuit chip which is much less expensive to manufacture, and which has outstanding connecting reliability is provided.

While the present invention has been described with reference to what are at present considered to be preferred embodiments, it is to be understood that various changes and modifications may be made thereto without departing from the invention in its broader aspects and therefore, it is intended that the appended claims cover all such changes and modifications that fall within the true spirit and scope of the invention.

What is claimed is:

1. A method of producing a high frequency circuit chip having a substrate made of a ceramic with a high dielectric constant, a wiring pattern provided on one main surface of the substrate, an electric conductor layer provided on substantially all of another main surface of the substrate, and a through-hole including a connecting electrode for connecting the wiring pattern and the conductor layer to each other, the method comprising the steps of:

filling electrically conductive paste into a perforation in the substrate, and firing the paste to form the connecting electrode of the through-hole;

forming a resist pattern with an opening having a desired shape and size directly on the substrate;

forming a thin film with a wiring material directly on the substrate through the opening over the resist pattern after forming the resist pattern;

removing the unnecessary wiring material thin film deposited on the resist pattern together with the resist pattern to form the wiring pattern directly on the substrate by a lift-off method;

mirror-polishing at least the surface of the fired substrate on which the wiring pattern is formed, and the fired substrate in which the through-hole having the connecting electrode is formed; and thereafter forming the wiring pattern on the mirror-polished surface by the lift-off method; wherein the thin film includes an adhesion layer formed on the substrate, a major conductor layer formed on the adhesion layer, a buffer layer formed on the major conductor layer, and a wire bonding layer formed on the buffer layer.

2. A method of producing a high frequency circuit chip according to claim 1, wherein the conductor layer is formed by applying and firing electrically conductive paste.

3. A method of producing a high frequency circuit chip according to claim 1, further comprising the steps of:

forming a protection film so as to cover the wiring pattern on the substrate, and cutting the substrate along desired dicing lines to obtain the high frequency circuit chip.

4. A method of producing a high frequency circuit chip according to claim 1, further comprising a step of forming a thin-film resistor pattern which is connected to the wiring pattern.

5. A method of producing a high frequency circuit chip according to claim 1, wherein the substrate has a relative dielectric constant of at least about 10.

6. A method of producing a high frequency circuit chip according to claim 1, includes the step of forming the wiring pattern formed on at least one main surface of the substrate and the electric conductor layer formed on substantially all of the other main surface by a conductor pattern containing at least one metal selected from the group consisting of Ag, Cu, and Al as a major component and having a thickness of at least about 2 $\mu$m.

7. A method of producing a high frequency circuit chip according to claim 1, wherein the connecting electrode of the through-hole is formed by electrically conductive paste including at least one metal selected from the group consisting of Ag, Cu, and Al as a major component.

8. A method of producing a high frequency circuit chip according to claim 1, wherein the thin film includes an adhesion layer.

9. A method of producing a high frequency circuit chip according to claim 1, wherein the thin film includes a wire bonding layer.

10. A method of producing a high frequency circuit chip according to claim 1, wherein the thin film includes a buffer layer.

11. A method of producing a high frequency circuit chip according to claim 1, further comprising the step of dipping the substrate into a rust inhibiting agent.

12. A method of producing a high frequency circuit chip having a substrate made of a ceramic having a high dielectric constant, a wiring pattern disposed on each of front and back main surfaces of the substrate, and a through-hole including a connecting electrode for connecting the wiring patterns disposed on the front and back main surfaces of the substrate, the method comprising the steps of:

filling electrically conductive paste into a perforation in the substrate, and firing the paste to form the connecting electrode of the through-hole;

forming a resist pattern with an opening having a predetermined shape and size directly on the substrate;

forming a thin film with a wiring material directly on the substrate through the opening over the resist pattern after forming the resist pattern;

removing the unnecessary wiring material thin film deposited on the resist pattern together with the resist pattern to form each wiring pattern directly on the substrate by the lift-off method;

mirror-polishing at least the surface of the fired substrate on which the wiring pattern is formed, and the fired substrate in which the through-hole having the connecting electrode is formed; and thereafter forming the wiring pattern on the mirror-polished surface by the lift-off method; wherein the thin film includes an adhesion layer formed on the substrate, a major conductor layer formed on the adhesion layer, a buffer layer formed on the major conductor layer, and a wire bonding layer formed on the buffer layer.

13. A method of producing a high frequency circuit chip according to claim 12, further comprising the step of forming the wiring patterns formed on both of the front and back main surfaces of the substrate by forming a conductor pattern including at least one metal selected from the group consisting of Ag, Cu, and Al as a major component and having a thickness of at least about 2 $\mu$m.

14. A method of producing a high frequency circuit chip according to claim 12, wherein the thin film includes an adhesion layer.

15. A method of producing a high frequency circuit chip according to claim 12, wherein the thin film includes a wire bonding layer.

16. A method of producing a high frequency circuit chip according to claim 12, wherein the thin film includes a buffer layer.

17. A method of producing a high frequency circuit chip according to claim 12, further comprising the step of dipping the substrate into a rust inhibiting agent.

* * * * *